United States Patent [19]
Chen et al.

[11] Patent Number: 5,768,294
[45] Date of Patent: Jun. 16, 1998

[54] MEMORY IMPLEMENTED ERROR DETECTION AND CORRECTION CODE CAPABLE OF DETECTING ERRORS IN FETCHING DATA FROM A WRONG ADDRESS

[75] Inventors: Chin-Long Chen, Fishkill; Mu-Yue Hsiao, Poughkeepsie, both of N.Y.; Walter Heinrich Lipponer, Ammerbuch, Germany; William Wu Shen, Poughkeepsie, N.Y.

[73] Assignee: International Business Machines Corporation, Armonk, N.Y.

[21] Appl. No.: 570,448

[22] Filed: Dec. 11, 1995

[51] Int. Cl.$^6$ .................................................. H03M 13/00
[52] U.S. Cl. .......................... 371/37.1; 371/37.2; 371/37.3; 371/32; 371/35; 371/40; 395/2.38; 395/831; 395/182.04; 395/828
[58] Field of Search .......................... 371/37.1, 32, 35, 371/37.2, 40.1; 395/2.38, 831, 182.04, 828

[56] References Cited

U.S. PATENT DOCUMENTS

| | | | |
|---|---|---|---|
| 3,623,155 | 11/1971 | Hsiao | 340/146 |
| 3,646,518 | 2/1972 | Weinstein | 371/35 |
| 4,439,859 | 3/1984 | Donnan | 371/32 |
| 4,464,753 | 8/1984 | Chen | 371/40.1 |
| 4,494,186 | 1/1985 | Goss et al. | 395/831 |
| 4,661,955 | 4/1987 | Arlington et al. | 395/182.04 |
| 4,713,776 | 12/1987 | Araseki | 395/2.38 |
| 4,803,623 | 2/1989 | Klashka et al. | 395/828 |
| 4,862,463 | 8/1989 | Chen | 371/40.1 |
| 4,961,193 | 10/1990 | Debord et al. | 371/37.2 |
| 4,970,714 | 11/1990 | Chen et al. | 370/216 |
| 5,058,115 | 10/1991 | Blake et al. | |
| 5,070,504 | 12/1991 | Bossen et al. | |
| 5,161,163 | 11/1992 | Bossen et al. | |
| 5,228,046 | 7/1993 | Blake et al. | |
| 5,600,659 | 2/1997 | Chen | 371/37.1 |

*Primary Examiner*—Reba I. Elmore
*Assistant Examiner*—McDieunel Marc
*Attorney, Agent, or Firm*—Lily Neff

[57] ABSTRACT

An apparatus and method is discussed using a parity check matrix in order to acheive correction and detection of errors particularly pertaining to detection data fetched from a wrong address. The code structure enhances utilization of chip reliability by encoding and decoding digital signals through the utilization of a parity check matrix and parity bits generated from system address bits of a computer system with k symbols and b bits per symbol.

21 Claims, 7 Drawing Sheets

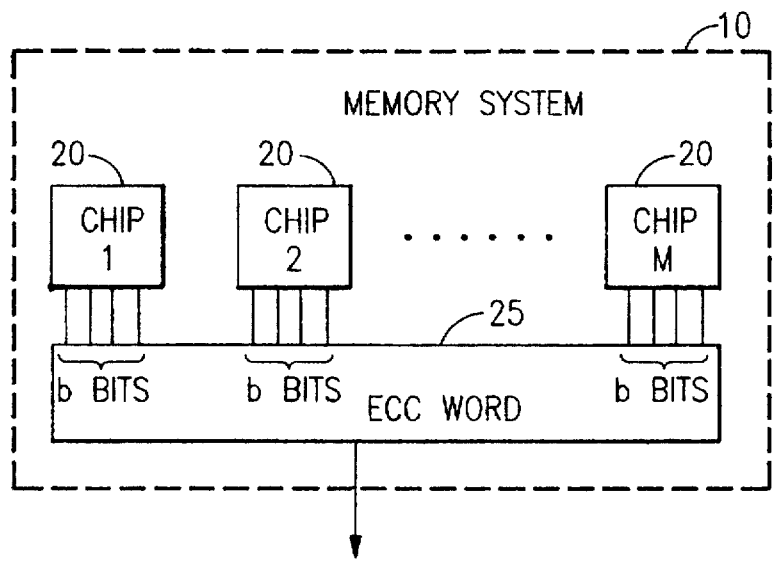
FIG.1
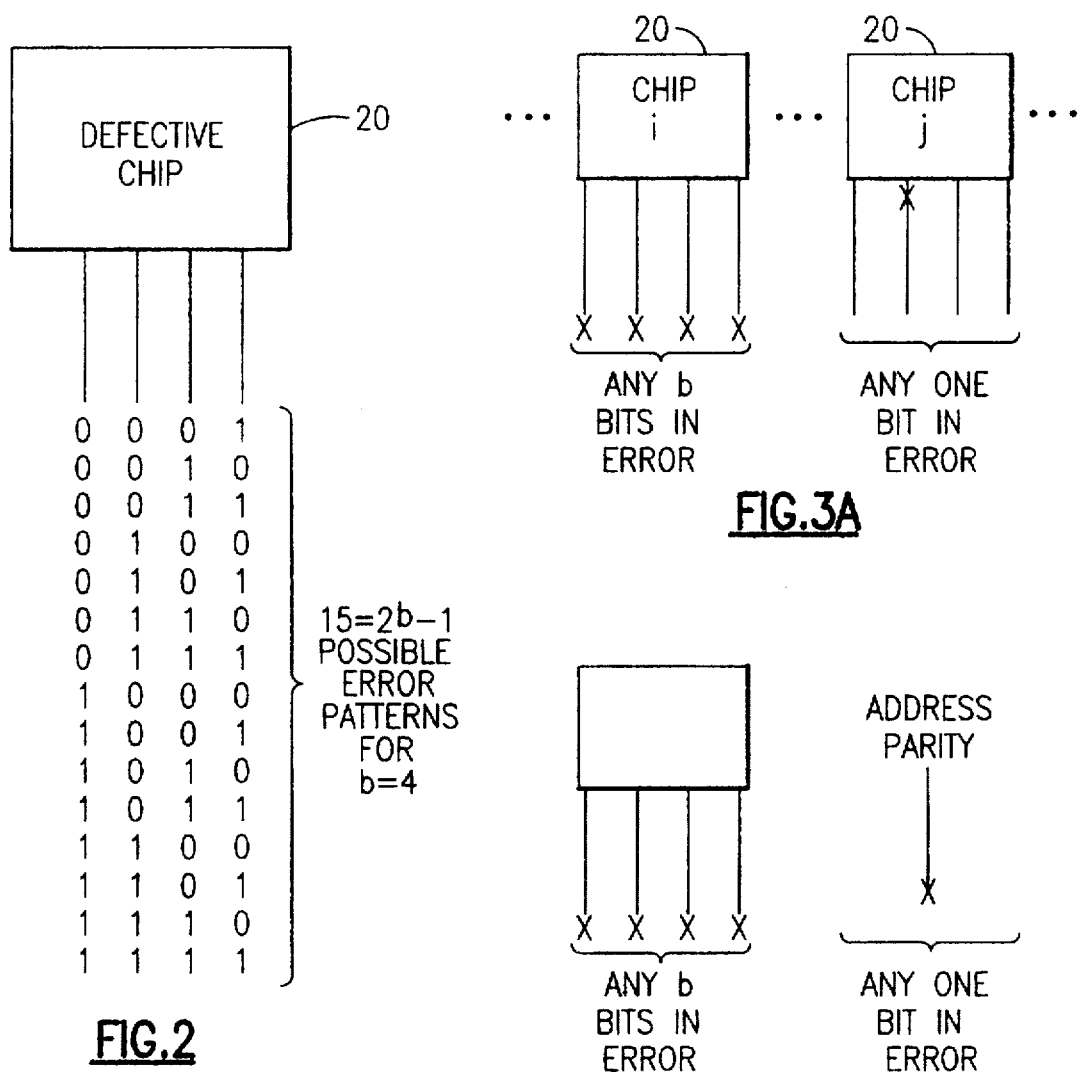
FIG.2
FIG.3A
FIG.3B

MEMORY IMPLEMENTED ERROR DETECTION AND CORRECTION CODE CAPABLE OF DETECTING ERRORS IN FETCHING DATA FROM A WRONG ADDRESS

BACKGROUND OF THE INVENTION

The present invention is generally directed to error correction, decoding and encoding systems found in digital devices. The present invention incorporates by reference the invention disclosed in the application filed Oct. 3, 1995 U.S. Ser. No. 08/538,691 entitled "error detection and correction code for four-bit-per-chip memory system" and directed to multi-bit-per chip computer memory systems in which error correction and detection apparatus are provided to acheive correction of all single symbol errors and the detection of all single symbol errors occurring with a single bit error in a second symbol. More particularly, the present invention is directed to a memory assignment scheme, which assigns error correction code words to selected array modules, and incorporates address parity bits in this assignment scheme in order to provide an error correction and detection method and apparatus capable of detecting a variety of errors, including the detection of data fetched from an erroneous address.

In a computer system having b bits of memory available per chip, the failure of each chip can cause one to b erroneous bits in the output data depending upon the failure mode and the data originally stored. A b bit symbol error pattern is used to indicate one of all of the possible $2^b-1$ error patterns in the b bits for each computer chip. Normal error correction and detection systems employed in such situations would involve the use of a single error correction (SEC) and double error detection (DED) code. The SEC-DED code, however, is neither effective in correcting symbol errors generated from single chip failures, nor is effective in detecting symbol errors generated from double chip failures. On the other hand, a single symbol error correction and double symbol error detection code, a so-called SSC-DSD code, would provide an effective error correction and detection method to acheive high reliability in a b bit per chip memory. However, SSC-DSD codes require more check bits and more memory chips than are actually necessary for the problem. In particular, for a 64-bit data bus, the required SSC-DSD code would require four redundant memory chips for every 16 data chips to implement a (78,64) SSC-DSD code. Such codes would be 78 bits in length with 64 information bits and 14 check bits. Thus a memory system implementing this code would require 20 chips based upon the above memory organization.

Recognizing the stringent requirements of the SSC-DSD memory system, the present inventors devised a new coding scheme as described in detail in U.S. Ser. No. 08/538,691, in which the number of redundant chips are decreased from 4 to 3 chips for a (76,64) code for each set of 16 chips. This code is then used to correct all single symbol errors and detect all single symbol errors plus a single bit error in a second symbol. In certain instances, however, although the data in storage is error free, an error condition can occur if data is fetched from the wrong address in memory. However, the invention introduced in U.S. Ser. No. 08/538,691 never addressed the issue of detection of data fetched from an erroneous address.

The present invention utilizes the coding scheme suggested in U.S. Ser. No. 08/538,691, but improves upon the code by generating address parity bits from system address bits and later including these in the generation of ECC word. Accordingly, a more efficient and more reliable improved computer memory system is provided through the use of the present invention. All of these are desirable results.

This application is related in subject matter to two other applications, Ser. Nos. 08/570,446 and 08/570,447 both filed on the same day as this application.

SUMMARY OF THE INVENTION

In accordance with a preferred embodiment of the present invention, digital signal encoding and decoding is accomplished through the utilization of a parity check matrix and parity bits generated from system address bits of a computer system with m symbols and b bits per symbol. The method of encoding data bits which are b bits in length comprise generating first the address parity bit or bits from the system address data bits. The address parity bit or bits are then used in conjunction with other data bits in generating a multiplicity, k, of multisegment final check bit vectors in which each segment of said final check bit vector is b bits long. The data bits and the final check bit vectors are then stored in different locations in the memory array of the computer.

A similar but reverse methodology is used for decoding the electrical signals for correcting errors in symbols which are b bits in length. First, the information pertaining to the previously stored data bits as well as the final check bit vectors are retrieved from the memory arrays. The address parity bits are generated using the previously stored data. Similarly, using the previously stored data as well as the generated parity bits a multiplicity, k, of multisegment final syndrome vectors in which each segment in each of said k final syndrome vector is kb bits long is generated and the final syndrome vector is then decoded to determine any possible errors. If any errors are detected, the signal may be corrected according to the symbol bits and type of error involved.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is an overall block diagram illustrating a memory system in which a memory word is stored on k separate chips each providing b bits to a computer memory system register;

FIG. 2 is a functional block diagram illustrating the 15 possible error patterns for the case in which there are four bits per chip;

FIG. 3A and 3B are functional block diagrams illustrating the limits of error detectability for the circuits of the present invention;

DETAILED DESCRIPTION OF THE INVENTION

The invention described below is particularly shown with respect to a particular example, namely the construction of a (76,64) code for a four-bit per chip computer memory system. However, the ideas presented herein are extensible to the general b bit per chip situation. In particular, it is noted that the number of rows of b by b submatrices in the parity check matrix is determined by the error correction capabilities that are desired. In the particular instance of the codes constructed in accordance with the present invention, three rows of by b submatrices are sufficient to provide the desired correction and detection capabilities. Likewise in general, codes constructed in accordance with the present invention will have k symbols. Each symbol will be represented by b bits. Since three of the symbols are employed for redundancy, there are thus k–3 information symbols and 3 symbols which comprise check bits.

Figure 9:
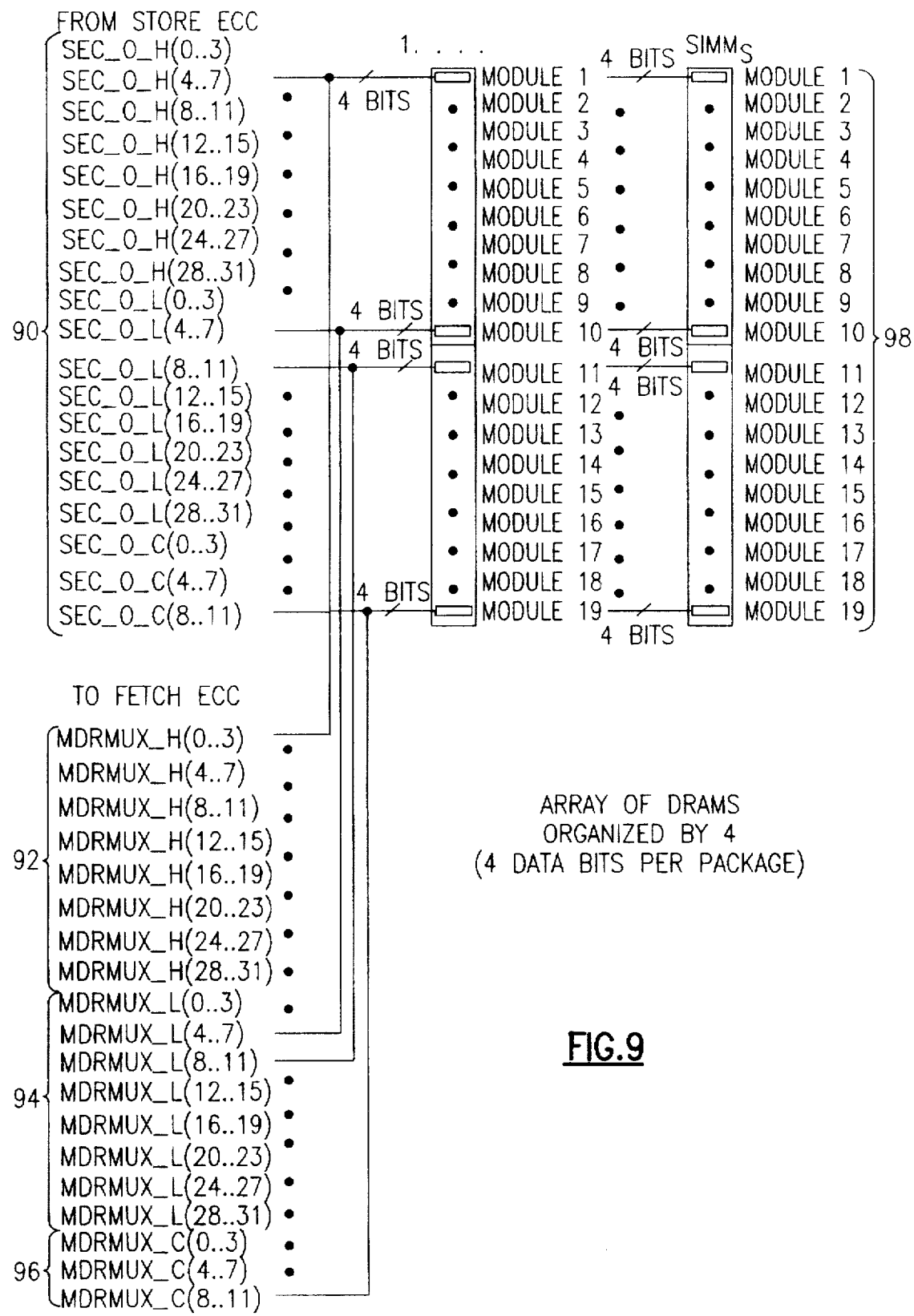
FIG. 9 illustrates the arrangement of data in memory modules on the SIMM array(s).

With respect to the present invention for a (76,64) code, the parity check matrix for this code including an embodiment utilizing two address parity bits is given below:

The set of 64 data bits together with the 12 check bits form an ECC word. Therefore, it seems that in the embodiment presented in Table I, when the two address parity bits are included, the ECC word is really a (78,66) code word. However, since the address parity bits can always be generated from the system address bits, it is unnecessary for them to be stored as part of the ECC word. Therefore, the code is still a (76,64) code since only 76 bits per code word are stored into the memory array or a SIMM (Single-Inline-Memory-Module) as shown in FIG. 9. The address parity bits are regenetated separately during the fetch operation from the previously stored system address bits.

The ECC word is divided into 19 groups of 4 bit symbols. In storing data, the ECC word is stored in 19 differnt chips. That is each symbol is stored on a different chip. This situation is illustrated in FIG. 1 wherein memory system 10 is shown to be organized using m chips with b bits being delivered from each chip at a time. Thus, the ECC word in register 25 is mb bits long. For the example illustrated herein, m=19 and b=4.

When an array chip, say chip i, fails the data stored in that chip may or may not be in error depending on the data stored. If the data is in error, the number of errors may be one or more than one. FIG. 2 illustrates all of the possible error patterns $2^b-1=15$ for a failed chip i. FIG. 3A and 3B illustrates the limits of error detectability in the present invention. FIG. 3A particularly shows the situation in which chip i produces from one to four errors while only a single error occurs in chip j. Reference numeral 20 in FIGS. 1 through 3 refer to the individual memory chips. FIG. 3B

TABLE I

| DATA | | | | | | | | | | | | | | | | ECC | | | SYMBOL ID (CHIP) | ADDRESS PARITY BITS |
|---|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 | 17 | 18 | 19 | ID | 20 |
| 1000 | 1000 | 1000 | 1000 | 1000 | 1000 | 1000 | 1000 | 1001 | 1101 | 1111 | 0011 | 1100 | 1100 | 1110 | 0110 | 1000 | 0000 | 0000 | ----- | 01 |
| 0100 | 0100 | 0100 | 0100 | 0100 | 0100 | 0100 | 0100 | 0111 | 1011 | 1010 | 0010 | 1000 | 1000 | 1001 | 1101 | 0100 | 0000 | 0000 | ----- | 11 |
| 0010 | 0010 | 0010 | 0010 | 0010 | 0010 | 0010 | 0010 | 0111 | 0110 | 1100 | 1111 | 0011 | 0011 | 1001 | 1011 | 0010 | 0000 | 0000 | ----- | 10 |
| 0001 | 0001 | 0001 | 0001 | 0001 | 0001 | 0001 | 0001 | 1110 | 1101 | 1000 | 1010 | 0010 | 0010 | 0111 | 0110 | 0001 | 0000 | 0000 | ----- | 11 |
| 0110 | 1000 | 0010 | 1011 | 1010 | 1101 | 0101 | 1110 | 1000 | 0001 | 1000 | 0111 | 1000 | 1110 | 1000 | 0100 | 0000 | 1000 | 0000 | ----- | 10 |
| 1101 | 0100 | 0001 | 0110 | 0101 | 1011 | 1111 | 1001 | 0100 | 0011 | 0100 | 1110 | 0100 | 1001 | 0100 | 1100 | 0000 | 0100 | 0000 | ----- | 01 |
| 1011 | 0010 | 0010 | 1101 | 1000 | 0110 | 0100 | 0010 | 0010 | 0101 | 0010 | 0010 | 0010 | 1001 | 0010 | 0001 | 0000 | 0010 | 0000 | ----- | 00 |
| 0110 | 0001 | 0101 | 1011 | 0100 | 1101 | 1100 | 0111 | 0001 | 1111 | 0001 | 1001 | 0001 | 0111 | 0001 | 0011 | 0000 | 0001 | 0000 | ----- | 00 |
| 1000 | 1110 | 0111 | 1010 | 1001 | 0010 | 0110 | 0001 | 0101 | 1000 | 1011 | 1000 | 0110 | 1000 | 0100 | 1000 | 0000 | 0000 | 1000 | ----- | 00 |
| 0100 | 1001 | 1110 | 0101 | 0111 | 0001 | 1101 | 0011 | 1111 | 0100 | 0110 | 0100 | 1101 | 0100 | 1100 | 0100 | 0000 | 0000 | 0100 | ----- | 00 |
| 0010 | 1001 | 1110 | 1000 | 0111 | 1010 | 1011 | 0101 | 0100 | 0010 | 1101 | 0010 | 1011 | 0010 | 0001 | 0010 | 0000 | 0000 | 0010 | ----- | 01 |
| 0001 | 0111 | 1001 | 0100 | 1110 | 0101 | 0110 | 1111 | 1100 | 0001 | 1011 | 0001 | 0110 | 0001 | 0011 | 0001 | 0000 | 0000 | 0001 | ----- | 10 |

DATA STORE OPERATION

During a store operation, in accordance with the embodiment represented by the parity check matrix shown in Table I, each of the 12 ECC check bits is generated. The 12 ECC check bits are generated in two stages. During the first stage, a partial ECC check bit is generated by exclusive OR circuits which take a subset of 64 data bits as indicated by the 1's in each row of the parity check matrix in Table I. For example, the first partial check bit is generated by exclusive-ORing data found at positions: 1, 5, 9, 13, 17, 21, 25, 29, 33, 36, 37, 38, 40, 41, 42, 43, 44, 47, 48, 49, 50, 53, 54, 57, 58, 59, 62 and 63.

The address parity bits are generated from selective combination of data from system address bits as discussed later in detail. During the second stage the partial check bits are combined with the address parity bits to generate the final 12 ECC check bits.

shows the situation in which chip i produces from one to four errors while only a single error occurs in the address parity bit.

At the outset of a store operation data bits are stored in a plurality of storage buffers. In the example illustrated in Table II, given below, the 64 data bits are first stored in two storage buffers named STBUF_H_D(0 . . . 31) and STBUF_L_D(0 . . . 31), respectively. There are 32 bits of data in each storage buffer and these bits are renamed as SEC_0_H(0 . . . 31) and SEC_0_L(0 . . . 31) when wired into the memory modules, namely the modules of a SIMM.

TABLE II

| STBUF_H_D(0..31) | | | | | | | |
|---|---|---|---|---|---|---|---|
| 0123 | 4567 | 11 8901 | 1111 2345 | 1111 6789 | 2222 0123 | 2222 4567 | 2233 8901 |
| 1000 | 1000 | 1000 | 1000 | 1000 | 1000 | 1000 | 1000 |
| 0100 | 0100 | 0100 | 0100 | 0100 | 0100 | 0100 | 0100 |
| 0010 | 0010 | 0010 | 0010 | 0010 | 0010 | 0010 | 0010 |
| 0001 | 0001 | 0001 | 0001 | 0001 | 0001 | 0001 | 0001 |
| 0110 | 1000 | 0010 | 1011 | 1010 | 1101 | 0101 | 1110 |
| 1101 | 0100 | 0001 | 0110 | 0101 | 1011 | 1111 | 1001 |
| 1011 | 0010 | 1010 | 1101 | 1000 | 0110 | 0100 | 1001 |
| 0110 | 0001 | 0101 | 1011 | 0100 | 1101 | 1100 | 0111 |
| 1000 | 1110 | 0111 | 1010 | 1001 | 0010 | 0110 | 0001 |
| 0100 | 1001 | 1110 | 0101 | 0111 | 0001 | 1101 | 0011 |
| 0010 | 1001 | 1110 | 1000 | 0111 | 1010 | 1011 | 0101 |
| 0001 | 0111 | 1001 | 0100 | 1110 | 0101 | 0110 | 1111 |

| STBUF_L_D(0..31) | | | | | | | | SEC_O_C(0..11) | | | STORE_ADDRP_D(0..1) |
|---|---|---|---|---|---|---|---|---|---|---|---|
| 0123 | 4567 | 11 8901 | 1111 2345 | 1111 6789 | 2222 0123 | 2222 4567 | 2233 8901 | 0123 | 4567 | 11 8901 | 01 |
| 1001 | 1101 | 1111 | 0011 | 1100 | 1100 | 1110 | 0110 | 1000 | 0000 | 0000 | 01 |
| 0111 | 1011 | 1010 | 0010 | 1000 | 1000 | 1001 | 1101 | 0100 | 0000 | 0000 | 11 |
| 0111 | 0110 | 1100 | 1111 | 0011 | 0011 | 1001 | 1011 | 0010 | 0000 | 0000 | 10 |
| 1110 | 1101 | 1000 | 1010 | 0010 | 0010 | 0111 | 0110 | 0001 | 0000 | 0000 | 11 |
| 1000 | 0001 | 1000 | 0111 | 1000 | 1110 | 1000 | 0100 | 0000 | 1000 | 0000 | 10 |
| 0100 | 0011 | 0100 | 1110 | 0100 | 1001 | 0100 | 1100 | 0000 | 0100 | 0000 | 01 |
| 0010 | 0101 | 0010 | 1110 | 0010 | 1001 | 0010 | 0001 | 0000 | 0010 | 0000 | 00 |
| 0001 | 1111 | 0001 | 1001 | 0001 | 0111 | 0001 | 0011 | 0000 | 0001 | 0000 | 00 |
| 0101 | 1000 | 1011 | 1000 | 0110 | 1000 | 0100 | 1000 | 0000 | 0000 | 1000 | 00 |
| 1111 | 0100 | 0110 | 0100 | 1101 | 0100 | 1100 | 0100 | 0000 | 0000 | 0100 | 00 |
| 0100 | 0010 | 1101 | 0010 | 1011 | 0010 | 0001 | 0010 | 0000 | 0000 | 0010 | 01 |
| 1100 | 0001 | 1011 | 0001 | 0110 | 0001 | 0011 | 0001 | 0000 | 0000 | 0001 | 10 |

The address parity bits are located in address buffers indicated as STORE_ADDRP_D(0...1) in Table II above. The address parity bits are generated from selective combination of data from system address bits as shown in the example provided below in Table III.

TABLE III

```
                         ADDRESS PARITY BITS
       - - 0 1 1 0 0 1 1 0 0 0 0 0 0 0 0 0 0 1 1 1 1 1 1 1 1 1 1 0 0 - - - -
       xxxxxxxxxxxxxxxxxxxxxxxxxxxxxxxxxxxxxxxxxxxxxxxxxxxxxxxxxxxxxxxx
                             SYSTEM ADDRESS
       2 2 3 3 0 0 0 0 0 0 0 0 0 0 1 1 1 1 1 1 1 1 1 1 2 2 2 2 2 2 2 2 3 3
       8 9 0 1 0 1 2 3 4 5 6 7 8 9 0 1 2 3 4 5 6 7 8 9 0 1 2 3 4 5 6 7 8 9 0 1
         BYTE 3   |    BYTE 4    |    BYTE 5    |    BYTE 6    |    BYTE 7
         4 5 6 7  | 0 1 2 3 4 5 6 7 | 0 1 2 3 4 5 6 7 | 0 1 2 3 4 5 6 7 | 0 1 2 3 4 5 6 7
       xxxxxxxxxxxxxxxxxxxxxxxxxxxxxxxxxxxxxxxxxxxxxxxxxxxxxxxxxxxxxxxx
        4 Mbit     R R R R R R R R R R R C C C C C C C C C E C|CAS| BYTE
        1 card              E 9 8 7 6 5 4 3 2 1 0 9 8 7 6 5 4 3 2 1 O 0|DEC| OFFSET
       16 Mbit     R R R R R R R R R R R R R C C C C C C C C C E C|CAS| BYTE
        1 card          E 11 10 9 8 7 6 5 4 3 2 1 0 9 8 7 6 5 4 3 2 1 O 0|DEC| OFFSET
                                                                   NOT USED
       64 Mbit     R R R C C R R R R R R R R R R R C C C C C C C C C E C|CAS| BYTE
        1 card      E 11 10 11 10 9 8 7 6 5 4 3 2 1 0 9 8 7 6 5 4 3 2 1 O 0|DEC| OFFSET
        4 Mbit     R C R R R R R R R R R R C C C C C C C C C E C|CAS| BYTE
        2 card             E 1 9 8 7 6 5 4 3 2 1 0 9 8 7 6 5 4 3 2 D O 0|DEC| OFFSET
       16 Mbit     R R R C R R R R R R R R R R C C C C C C C C C E C|CAS| BYTE
        2 card          E 10 11 1 9 8 7 6 5 4 3 2 1 0 9 8 7 6 5 4 3 2 D O 0|DEC| OFFSET
                                                                   NOT USED
       64 Mbit     R C R R C C R R R R R R R R R R R C C C C C C C C C E C|CAS| BYTE
        2 card      E 10 11 10 11 1 9 8 7 6 5 4 3 2 1 0 9 8 7 6 5 4 3 2 D O 0|DEC| OFFSET
        4 Mbit     R C C R R R R R R R R R R C C C C C C C C C E C|CAS| BYTE
        4 card          E 2 1 9 8 7 6 5 4 3 2 1 0 9 8 7 6 5 4 3 D D O 0|DEC| OFFSET
       16 Mbit     R R R C R R R R R R R R R R C C C C C C C C C E C|CAS| BYTE
        4 card        E 11 10 2 1 9 8 7 6 5 4 3 2 1 0 9 8 7 6 5 4 3 D D O 0|DEC| OFFSET
                                                                   NOT USED
```

TABLE III-continued

| 64 Mbit 4 card | R C C R R C C R R R R R R R R R C C C C C C C C C E<br>E111011102 1 9 8 7 6 5 4 3 2 1 0 9 8 7 6 5 4 3 D D O O | C|CAS|<br>|DEC| | BYTE<br>OFFSET |
|---|---|---|---|

CD means memory card selection bit
C0-C11 means Column Address 0-11
R0-R11 means Row Address 0-11
EO means even/odd lines (on STC inter-leaving)
RE means RAS A/B decode STORE_ADDRP_D(0) is generated from the parity of system address bits 1, 2, 5-14, 26, 27 and 30. Similarly, STORE_ADDRP_D(1) is the parity of system address bits 0, 3, 4, 5-25, and 31. As illustrated in table III, the mapping of system address bits to memory module depends on the size of the modules.

The final ECC check bits are then generated by combining the contents of the STORE_ADDRP with the data stored in the storage buffers STBUF and the data obtained from the partial check bits generated from the Exclusive-Or circuitry. In short, during the first stage, the partial check bits SY0(0 . . . 11) are generated from the high word data word STBUF_H_D(0 . . . 31) and SY1(0 . . . 11) are generated from the low data word STBUF_L_D(0 . . . 31). Then SY0 and SY1 and address parity bits are combined to produce the final check bits. The final 12 ECC check bits are stored in SEC_0_C(0 . . . 11) buffer. The following equation illustrates in detail the generation of the 12 ECC check bits and their final storage in the SEC_0_C(0 . . . 11) buffer.

The notation OPA(X||Y||Z) is used to describe a logic function that implements the odd parity of bits X,Y and Z. The generation of check bits is divided in two stages as mentioned earlier.

```
/***************** STORE ECC *****************************/
/********************************************************/ /*>
CHECKBIT GENERATION <*/
/********************************************************/
SY0(0) :=
    OPA(STBUF_H_D(0) ||STBUF_H_D(4) ||STBUF_H_D(8) ||STBUF_H_D(12)
       ||STBUF_H_D(16)||STBUF_H_D(20)||STBUF_H_D(24)||STBUF_H_D(28));
SY1(0) :=
    OPA(STBUF_L_D(0) ||STBUF_L_D(3) ||STBUF_L_D(4) ||STBUF_L_D(5)
       ||STBUF_L_D(7) ||STBUF_L_D(8) ||STBUF_L_D(9) ||STBUF_L_D(10)
       ||STBUF_L_D(11)||STBUF_L_D(14)||STBUF_L_D(15)||STBUF_L_D(16)
       ||STBUF_L_D(17)||STBUF_L_D(20)||STBUF_L_D(21)||STBUF_L_D(24)
       ||STBUF_L_D(25)||STBUF_L_D(26)||STBUF_L_D(29)||STBUF_L_D(30));
SY0(1) :=
    OPA(STBUF_H_D(1) ||STBUF_H_D(5) ||STBUF_H_D(9) ||STBUF_H_D(13)
       ||STBUF_H_D(17)||STBUF_H_D(21)||STBUF_H_D(25)||STBUF_H_D(29));
SY1(1) :=
    OPA(STBUF_L_D(1) ||STBUF_L_D(2) ||STBUF_L_D(3) ||STBUF_L_D(4)
       ||STBUF_L_D(6) ||STBUF_L_D(7) ||STBUF_L_D(8) ||STBUF_L_D(10)
       ||STBUF_L_D(14)||STBUF_L_D(16)||STBUF_L_D(20)||STBUF_L_D(24)
       ||STBUF_L_D(27)||STBUF_L_D(28)||STBUF_L_D(29)||STBUF_L_D(31));
SY0(2) :=
    OPA(STBUF_H_D(2) ||STBUF_H_D(6) ||STBUF_H_D(10)||STBUF_H_D(14)
       ||STBUF_H_D(18)||STBUF_H_D(22)||STBUF_H_D(26)||STBUF_H_D(30));
SY1(2) :=
    OPA(STBUF_L_D(1) ||STBUF_L_D(2) ||STBUF_L_D(3) ||STBUF_L_D(5)
       ||STBUF_L_D(6) ||STBUF_L_D(8) ||STBUF_L_D(9) ||STBUF_L_D(12)
       ||STBUF_L_D(13)||STBUF_L_D(14)||STBUF_L_D(15)||STBUF_L_D(18)
       ||STBUF_L_D(19)||STBUF_L_D(22)||STBUF_L_D(23)||STBUF_L_D(24)
       ||STBUF_L_D(27)||STBUF_L_D(28)||STBUF_L_D(30)||STBUF_L_D(31));
SY0(3) :=
    OPA(STBUF_H_D(3) ||STBUF_H_D(7) ||STBUF_H_D(11)||STBUF_H_D(15)
       ||STBUF_H_D(19)||STBUF_H_D(23)||STBUF_H_D(27)||STBUF_H_D(31));
SY1(3) :=
    OPA(STBUF_L_D(0) ||STBUF_L_D(1) ||STBUF_L_D(2) ||STBUF_L_D(4)
       ||STBUF_L_D(5) ||STBUF_L_D(7) ||STBUF_L_D(8) ||STBUF_L_D(12)
       ||STBUF_L_D(14)||STBUF_L_D(18)||STBUF_L_D(22)||STBUF_L_D(25)
       ||STBUF_L_D(26)||STBUF_L_D(27)||STBUF_L_D(29)||STBUF_L_D(30));
SY0(4) :=
    OPA(STBUF_H_D(1) ||STBUF_H_D(2) ||STBUF_H_D(4) ||STBUF_H_D(10)
       ||STBUF_H_D(12)||STBUF_H_D(14)||STBUF_H_D(15)||STBUF_H_D(16)
       ||STBUF_H_D(18)||STBUF_H_D(20)||STBUF_H_D(21)||STBUF_H_D(23)
       ||STBUF_H_D(25)||STBUF_H_D(27)||STBUF_H_D(28)||STBUF_H_D(29)
       ||STBUF_H_D(30));
SY1(4) :=
    OPA(STBUF_L_D(0) ||STBUF_L_D(7) ||STBUF_L_D(8) ||STBUF_L_D(13)
       ||STBUF_L_D(14)||STBUF_L_D(15)||STBUF_L_D(16)||STBUF_L_D(20)
       ||STBUF_L_D(21)||STBUF_L_D(22)||STBUF_L_D(24)||STBUF_L_D(29));
SY0(5) :=
    OPA(STBUF_H_D(0) ||STBUF_H_D(1) ||STBUF_H_D(3) ||STBUF_H_D(5)
```

-continued

```
       ||STBUF_H_D(11)||STBUF_H_D(13)||STBUF_H_D(14)||STBUF_H_D(17)
       ||STBUF_H_D(19)||STBUF_H_D(20)||STBUF_H_D(22)||STBUF_H_D(23)
       ||STBUF_H_D(24)||STBUF_H_D(25)||STBUF_H_D(26)||STBUF_H_D(27)
       ||STBUF_H_D(28)||STBUF_H_D(31));
SY1(5) :=
       OPA(STBUF_L_D(1) ||STBUF_L_D(6) ||STBUF_L_D(7) ||STBUF_L_D(9)
       ||STBUF_L_D(12)||STBUF_L_D(13)||STBUF_L_D(14)||STBUF_L_D(17)
       ||STBUF_L_D(20)||STBUF_L_D(23)||STBUF_L_D(25)||STBUF_L_D(28)
       ||STBUF_L_D(29));
SY0(6) :=
       OPA(STBUF_H_D(0) ||STBUF_H_D(2) ||STBUF_H_D(3) ||STBUF_H_D(6)
       ||STBUF_H_D(8) ||STBUF_H_D(10)||STBUF_H_D(12)||STBUF_H_D(13)
       ||STBUF_H_D(15)||STBUF_H_D(16)||STBUF_H_D(21)||STBUF_H_D(22)
       ||STBUF_H_D(25)||STBUF_H_D(28)||STBUF_H_D(31));
SY1(6) :=
       OPA(STBUF_L_D(2) ||STBUF_L_D(5) ||STBUF_L_D(7) ||STBUF_L_D(10)
       ||STBUF_L_D(12)||STBUF_L_D(13)||STBUF_L_D(14)||STBUF_L_D(18)
       ||STBUF_L_D(20)||STBUF_L_D(23)||STBUF_L_D(26)||STBUF_L_D(31));
SY0(7) :=
       OPA(STBUF_H_D(1) ||STBUF_H_D(2) ||STBUF_H_D(7) ||STBUF_H_D(9)
       ||STBUF_H_D(11)||STBUF_H_D(12)||STBUF_H_D(14)||STBUF_H_D(15)
       ||STBUF_H_D(17)||STBUF_H_D(20)||STBUF_H_D(21)||STBUF_H_D(23)
       ||STBUF_H_D(24)||STBUF_H_D(25)||STBUF_H_D(29)||STBUF_H_D(30)
       ||STBUF_H_D(31));
SY1(7) :=
       OPA(STBUF_L_D(3) ||STBUF_L_D(4) ||STBUF_L_D(5) ||STBUF_L_D(6)
       ||STBUF_L_D(7) ||STBUF_L_D(11)||STBUF_L_D(12)||STBUF_L_D(15)
       ||STBUF_L_D(19)||STBUF_L_D(21)||STBUF_L_D(22)||STBUF_L_D(23)
       ||STBUF_L_D(27)||STBUF_L_D(30)||STBUF_L_D(31));
SY0(8) :=
       OPA(STBUF_H_D(0) ||STBUF_H_D(4) ||STBUF_H_D(5) ||STBUF_H_D(6)
       ||STBUF_H_D(9) ||STBUF_H_D(10)||STBUF_H_D(11)||STBUF_H_D(12)
       ||STBUF_H_D(14)||STBUF_H_D(16)||STBUF_H_D(19)||STBUF_H_D(22)
       ||STBUF_H_D(25)||STBUF_H_D(26)||STBUF_H_D(31));
SY1(8) :=
       OPA(STBUF_L_D(1) ||STBUF_L_D(3) ||STBUF_L_D(4) ||STBUF_L_D(8)
       ||STBUF_L_D(10)||STBUF_L_D(11)||STBUF_L_D(12)||STBUF_L_D(17)
       ||STBUF_L_D(18)||STBUF_L_D(20)||STBUF_L_D(25)||STBUF_L_D(28));
SY0(9) :=
       OPA(STBUF_H_D(1) ||STBUF_H_D(4) ||STBUF_H_D(7) ||STBUF_H_D(8)
       ||STBUF_H_D(9) ||STBUF_H_D(10)||STBUF_H_D(13)||STBUF_H_D(15)
       ||STBUF_H_D(17)||STBUF_H_D(18)||STBUF_H_D(19)||STBUF_H_D(23)
       ||STBUF_H_D(24)||STBUF_H_D(25)||STBUF_H_D(27)||STBUF_H_D(30)
       ||STBUF_H_D(31));
SY1(9) :=
       OPA(STBUF_L_D(0) ||STBUF_L_D(1) ||STBUF_L_D(2) ||STBUF_L_D(3)
       ||STBUF_L_D(5) ||STBUF_L_D(9) ||STBUF_L_D(10)||STBUF_L_D(13)
       ||STBUF_L_D(16)||STBUF_L_D(17)||STBUF_L_D(19)||STBUF_L_D(21)
       ||STBUF_L_D(24)||STBUF_L_D(25)||STBUF_L_D(29));
SY0(10) :=
       OPA(STBUF_H_D(2) ||STBUF_H_D(4) ||STBUF_H_D(7) ||STBUF_H_D(8)
       ||STBUF_H_D(9) ||STBUF_H_D(10)||STBUF_H_D(12)||STBUF_H_D(17)
       ||STBUF_H_D(18)||STBUF_H_D(19)||STBUF_H_D(20)||STBUF_H_D(22)
       ||STBUF_H_D(24)||STBUF_H_D(26)||STBUF_H_D(27)||STBUF_H_D(29)
       ||STBUF_H_D(31));
SY1(10) :=
       OPA(STBUF_L_D(1) ||STBUF_L_D(6) ||STBUF_L_D(8) ||STBUF_L_D(9)
       ||STBUF_L_D(11)||STBUF_L_D(14)||STBUF_L_D(16)||STBUF_L_D(18)
       ||STBUF_L_D(19)||STBUF_L_D(22)||STBUF_L_D(27)||STBUF_L_D(30));
SY0(11) :=
       OPA(STBUF_H_D(3) ||STBUF_H_D(5) ||STBUF_H_D(6) ||STBUF_H_D(7)
       ||STBUF_H_D(8) ||STBUF_H_D(11)||STBUF_H_D(13)||STBUF_H_D(16)
       ||STBUF_H_D(17)||STBUF_H_D(18)||STBUF_H_D(21)||STBUF_H_D(23)
       ||STBUF_H_D(25)||STBUF_H_D(26)||STBUF_H_D(28)||STBUF_H_D(29)
       ||STBUF_H_D(30)||STBUF_H_D(31));
SY1(11) :=
       OPA(STBUF_L_D(0) ||STBUF_L_D(1) ||STBUF_L_D(7) ||STBUF_L_D(8)
       ||STBUF_L_D(10)||STBUF_L_D(11)||STBUF_L_D(15)||STBUF_L_D(17)
       ||STBUF_L_D(18)||STBUF_L_D(23)||STBUF_L_D(26)||STBUF_L_D(27)
       ||STBUF_L_D(31));
SEC_O_C(0)   := SY0(0)    XOR SY1(0)    XOR STORE_ADDRP_D(1);
SEC_O_C(1)   := SY0(1)    XOR SY1(1)    XOR STORE_ADDRP_D(0)
                                        XOR STORE_ADDRP_D(1);
SEC_O_C(2)   := SY0(2)    XOR SY1(2)    XOR STORE_ADDRP_D(0);
SEC_O_C(3)   := SY0(3)    XOR SY1(3)    XOR STORE_ADDRP_D(0)
                                        XOR STORE_ADDRP_D(1);
SEC_O_C(4)   := SY0(4)    XOR SY1(4)    XOR STORE_ADDRP_D(0);
SEC_O_C(5)   := SY0(5)    XOR SY1(5)    XOR STORE_ADDRP_D(1);
SEC_O_C(6)   := SY0(6)    XOR SY1(6)                        ;
SEC_O_C(7)   := SY0(7)    XOR SY1(7)                        ;
```

-continued

| | | | |
|---|---|---|---|
| SEC_O_C(8) | := SY0(8) | XOR SY1(8) | ; |
| SEC_O_C(9) | := SY0(9) | XOR SY1(9) | ; |
| SEC_O_C(10) | := SY0(10) | XOR SY1(10) | XOR STORE ADDRP D(1); |
| SEC_O_C(11) | := SY0(11) | XOR SY1(11) | XOR STORE_ADDRP_D(0); |

Figure 4:
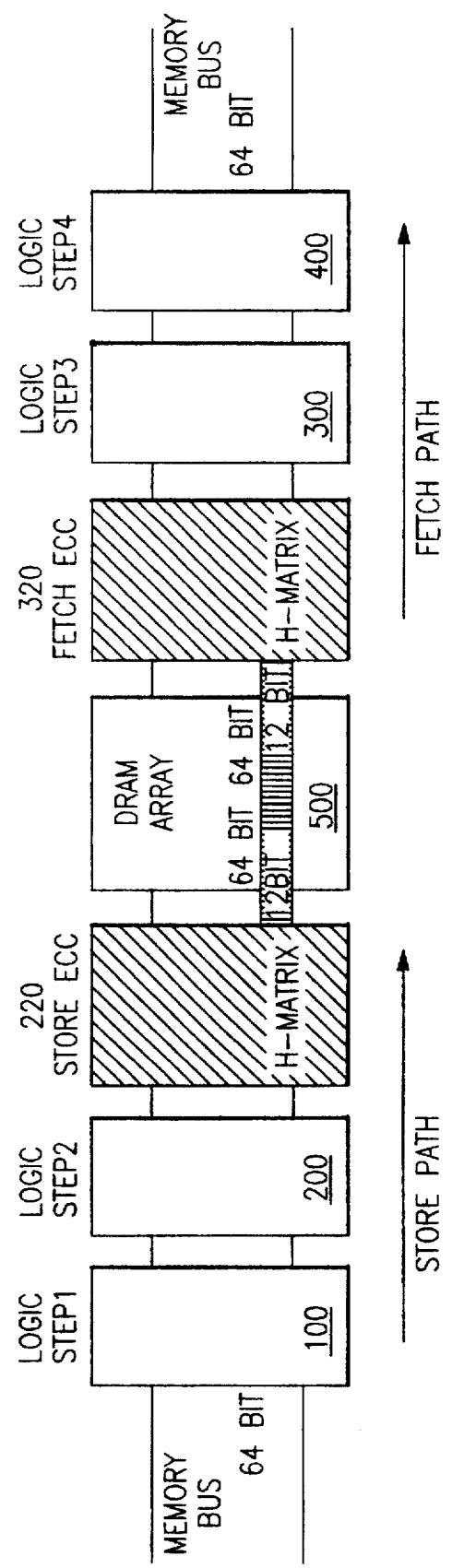
FIG. 4 is a general ECC (Error Correction Code) flow diagram, illustrating various staging registers and line buffers involved in the store and fetch operations for the present invention.

FIG. 4 is an illustration of the general ECC flow diagram. Logic steps 1 through 4, 100 through 400, are the various staging registers and line buffers used in the data store and data fetch operations. Logic steps 1 and 2, 100 and 200, involve different operations that finally allow the generation of ECC store operation 220 into the computer memory DRAM array 500. This information is later fetched from the DRAM array 500 to regenerate and decode the bits during the fetch operation, 300 through 400.

Figure 5:
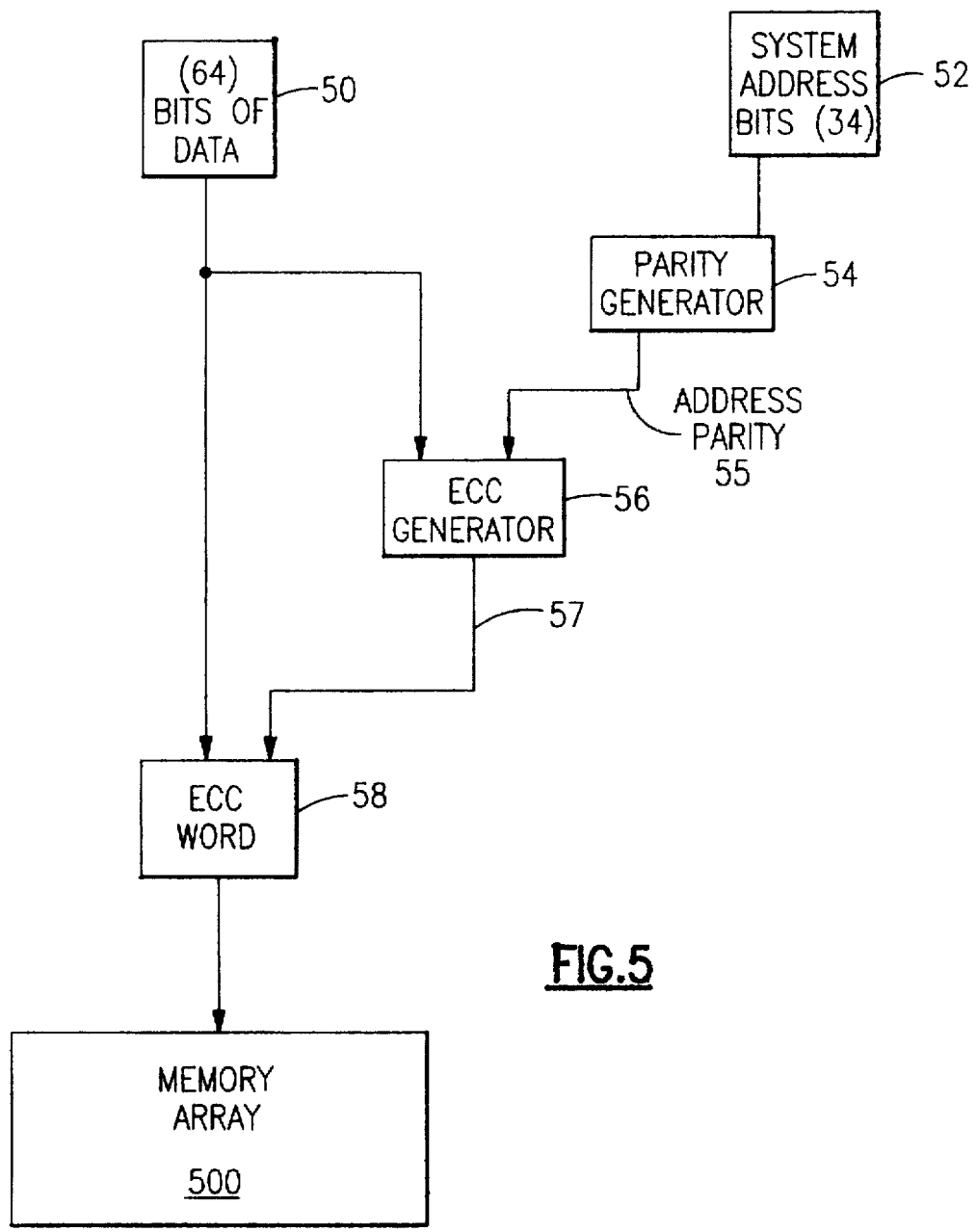
FIG. 5 is an illustration of the processing of bits during a data store operation.
Figure 6:
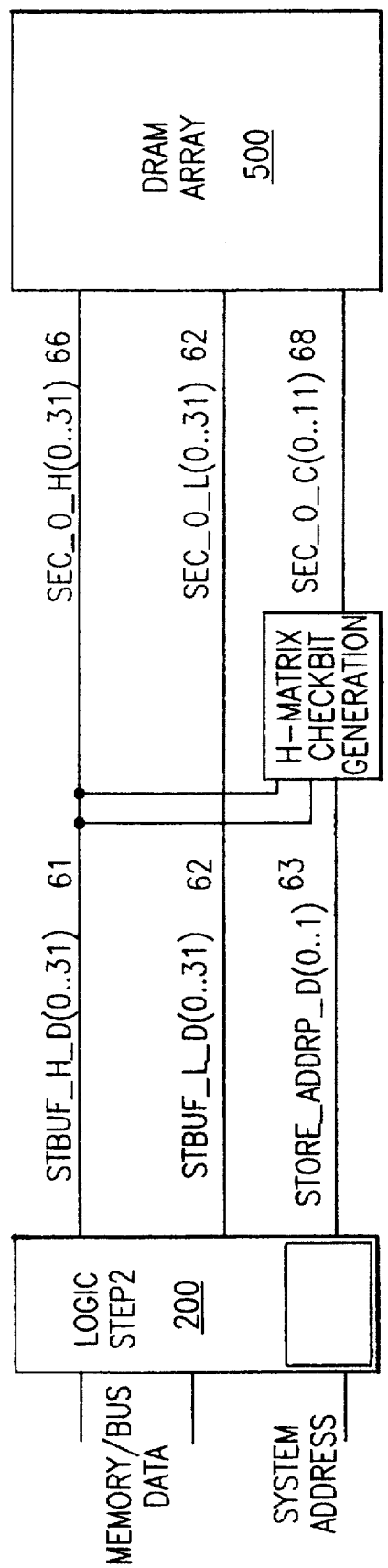
FIG. 6 is a further illustration of the operation of a data store command according to the concepts presented by the present invention.

During the store operation, the ECC check bits 57 are generated from the 64 data bits 50 and the system address bits 52 as shown FIG. 5. The entire ECC word 58 is then stored into a memory array 500 to be used later during a fetch operation. FIG. 6 shows the storage of data in storage arrays 61, 62 and 63 before the generation of check bits 66,67 and 68.

Table I above is an embodiment of the present invention utilizing two address parity bits. Other embodiments are conceivable, however, in accordance to the concepts of the present invention where the number of address parity bits, can either be reduced to one or increased to more than two. Table IV given below provides another embodiment of the present invention where eight address parity bits are generated and used.

TABLE IV

| DATA | | | | | | | | | | | | | | | | ECC | | | SYMBOL ID (CHIP) | ADDRESS PARITY BITS | |
|---|---|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 | 17 | 18 | 19 | ID | 20 | 21 |
| 1000 | 1000 | 1000 | 1000 | 1000 | 1000 | 1000 | 1000 | 1001 | 1101 | 1111 | 0011 | 1100 | 1100 | 1110 | 0110 | 1000 | 0000 | 0000 | ---- | 0111 | 1101 |
| 0100 | 0100 | 0100 | 0100 | 0100 | 0100 | 0100 | 0100 | 0111 | 1011 | 1010 | 0010 | 1000 | 1000 | 1001 | 1101 | 0100 | 0000 | 0000 | ---- | 1111 | 0010 |
| 0010 | 0010 | 0010 | 0010 | 0010 | 0010 | 0010 | 0010 | 0111 | 0110 | 1100 | 1111 | 0011 | 0011 | 1001 | 1011 | 0010 | 0000 | 0000 | ---- | 1011 | 0111 |
| 0001 | 0001 | 0001 | 0001 | 0001 | 0001 | 0001 | 0001 | 1110 | 1101 | 1000 | 1010 | 0010 | 0010 | 0111 | 0110 | 0001 | 0000 | 0000 | ---- | 1100 | 1101 |
| 0110 | 1000 | 0010 | 1011 | 1010 | 1101 | 0101 | 1110 | 1000 | 0001 | 1000 | 0111 | 1000 | 1110 | 1000 | 0100 | 0000 | 1000 | 0000 | ---- | 1000 | 0011 |
| 1101 | 0100 | 0001 | 0110 | 0101 | 1011 | 1111 | 1001 | 0100 | 0011 | 0100 | 1110 | 0100 | 1001 | 0100 | 1100 | 0000 | 0100 | 0000 | ---- | 0110 | 0111 |
| 1011 | 0010 | 1010 | 1101 | 1000 | 0110 | 0100 | 1001 | 0010 | 0101 | 0010 | 1110 | 0010 | 1001 | 0010 | 0001 | 0000 | 0010 | 0000 | ---- | 0001 | 0010 |
| 0110 | 0001 | 0101 | 1011 | 0100 | 1101 | 1100 | 0111 | 0001 | 1111 | 0001 | 1001 | 0001 | 0111 | 0001 | 0011 | 0000 | 0001 | 0000 | ---- | 0000 | 1110 |
| 1000 | 1110 | 0111 | 1010 | 1001 | 0010 | 0110 | 0001 | 0101 | 1000 | 1011 | 1000 | 0110 | 1000 | 0100 | 1000 | 0000 | 0000 | 1000 | ---- | 0000 | 1100 |
| 0100 | 1001 | 1110 | 0101 | 0111 | 1101 | 1101 | 1111 | 0100 | 0110 | 0100 | 1101 | 0010 | 0100 | 0100 | 0100 | 0000 | 0000 | 0100 | ---- | 0001 | 1010 |
| 0010 | 1001 | 1110 | 1000 | 0111 | 1010 | 1011 | 0101 | 0100 | 0010 | 1101 | 0010 | 1011 | 0010 | 0001 | 0010 | 0000 | 0000 | 0010 | ---- | 0110 | 1000 |
| 0001 | 0111 | 1001 | 0100 | 1110 | 0101 | 0110 | 1111 | 1100 | 0001 | 1011 | 0001 | 0110 | 0001 | 0011 | 0001 | 0000 | 0000 | 0001 | ---- | 1011 | 1001 |

DATA FETCH OPERATION

Figure 7:
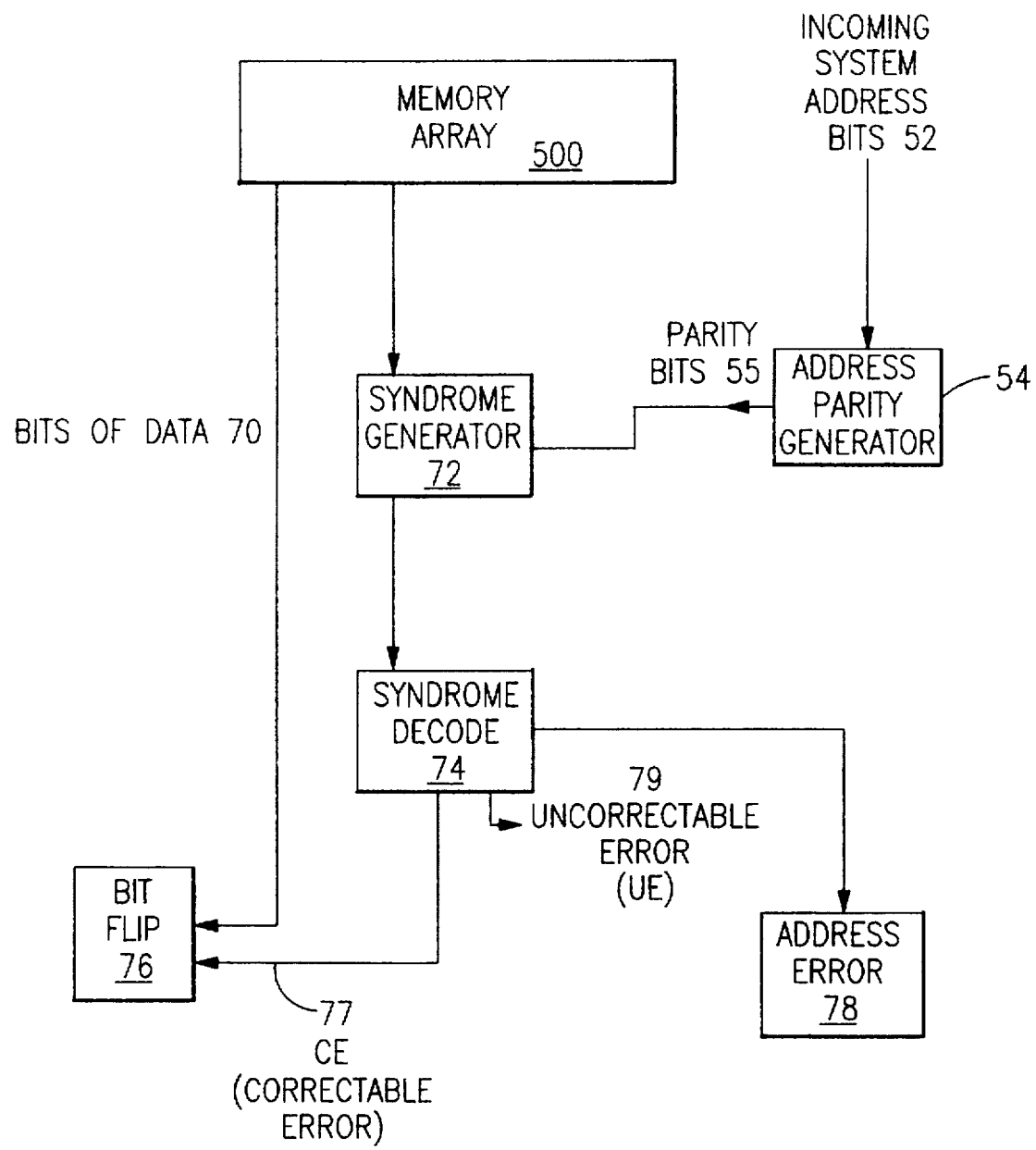
FIG. 7 is an illustration of the processing of bits during a data fetch operation.
Figure 8:
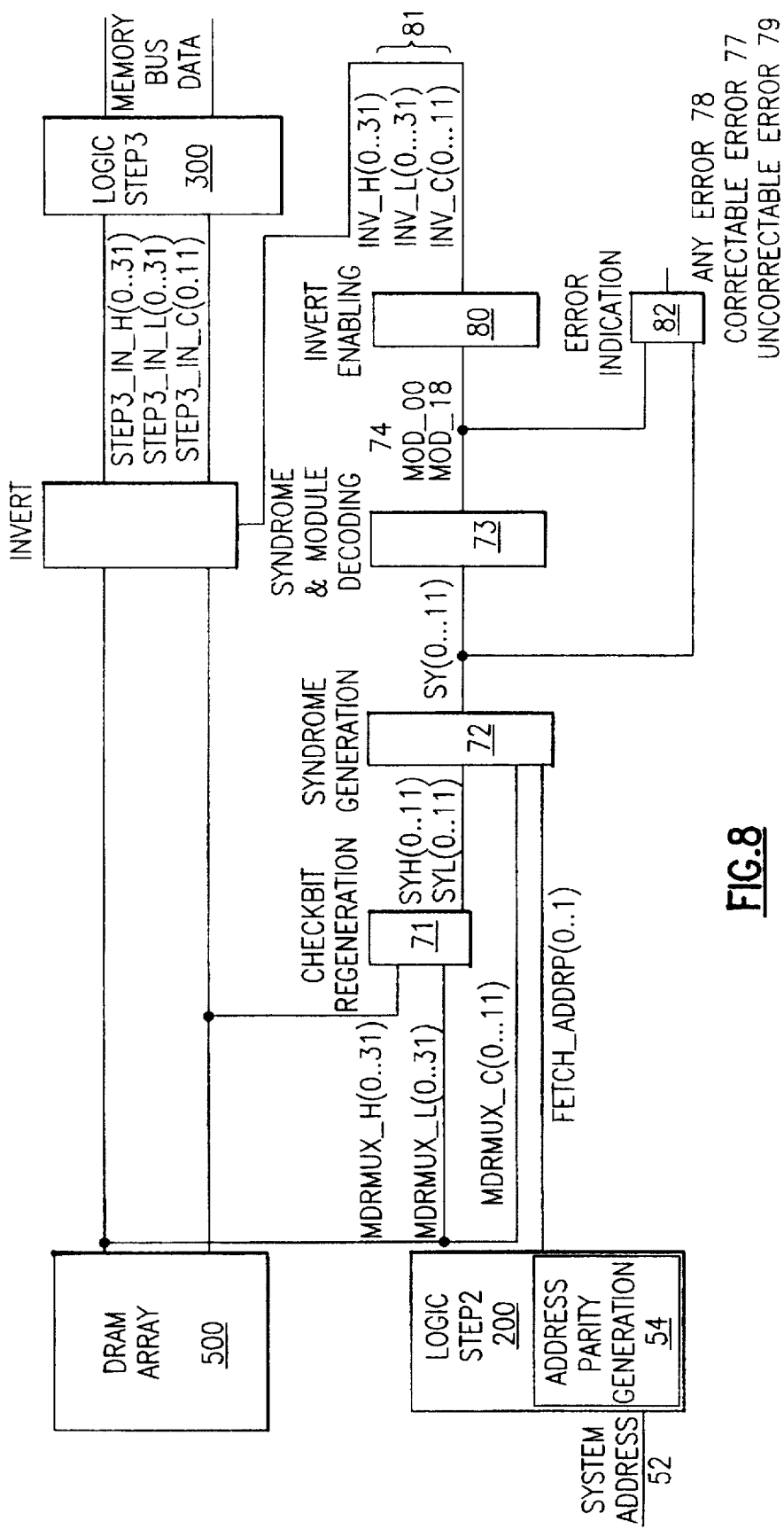
FIG. 8 is a further illustration of the operation of a data fetch command according to the concepts presented by the present invention.

During a Fetch operation, the reverse of the store process implemented during the store operation is used as shown in FIGS. 7 and 8. Data 70, 72 and 55, including the ECC word, is first fetched from memory 500, as shown in FIG. 7. FIG. 9 illustrates the circuits used during an ECC fetch operation. Data fetched from the DRAM array chips are named MDRMUX_H(0 . . . 31) 92 for modules 1 to 8, MDRMUX_L(0 . . . 31) 94 for modules 9 to 16 and MDRMUX_C(0 . . . 11) 96 for modules 17 to 19.

When data is fetched from storage, a set of partial syndrome bits SYH(0 . . . 11) and SYL(0 . . . 11) is generated from the fetched data word from the DRAM array chips or the MDRMUX as illustrated in detail by the following equation:

```
/********** FETCH ******************************************/
/************************************************************/ /*>
CHECKBIT REGENERATION <*/
/************************************************************/
SYH(0):= OPA(MDRMUX_H(0) ||MDRMUX_H(4) ||MDRMUX_H(8) ||MDRMUX_H(12)
       ||MDRMUX_H(16)||MDRMUX_H(20)81 MDRMUX_H(24)||MDRMUX_H(28));
SYL(0):= OPA(MDRMUX_L(0) ||MDRMUX_L(3) ||MDRMUX_L(4) ||MDRMUX_L(5)
       ||MDRMUX_L(7) ||MDRMUX_L(8) ||MDRMUX_L(9) ||MDRMUX_L(10)
       ||MDRMUX_L(11)||MDRMUX_L(14)||MDRMUX_L(15)||MDRMUX_L(16)
       ||MDRMUX_L(17)||MDRMUX_L(20)||MDRMUX_L(21)||MDRMUX_L(24)
       ||MDRMUX_L(25)||MDRMUX_L(26)||MDRMUX_L(29)||MDRMUX_L(30));
SYH(1):= OPA(MDRMUX_H(1) ||MDRMUX_H(5) ||MDRMUX_H(9) ||MDRMUX_H(13)
       ||MDRMUX_H(17)||MDRMUX_H(21)||MDRMUX_H(25)||MDRMUX_H(29));
SYL(1):= OPA(MDRMUX_L(1) ||MDRMUX_L(2) ||MDRMUX_L(3) ||MDRMUX_L(4)
       ||MDRMUX_L(6) ||MDRMUX_L(7) ||MDRMUX_L(8) ||_MDRMUX_L(10)
       ||MDRMUX_L(14)||MDRMUX_L(16)||MDRMUX_L(20)||MDRMUX_L(24)
       ||MDRMUX_L(27)||MDRMUX_L(28)||MDRMUX_L(29)||MDRMUX_L(31));
SYH(2):= OPA(MDRMUX_H(2) ||MDRMUX_H(6) ||MDRMUX_H(10)||MDRMUX_H(14)
       ||MDRMUX_H(18)||MDRMUX_H(22)||MDRMUX_H(26)||MDRMUX_H(30));
SYL(2):= OPA(MDRMUX_L(1) ||MDRMUX_L(2) ||MDRMUX_L(3) ||MDRMUX_L(5)
       ||MDRMUX_L(6) ||MDRMUX_L(8) ||MDRMUX_L(9) ||MDRMUX_L(12)
       ||MDRMUX_L(13)||MDRMUX_L(14)||MDRMUX_L(15)||MDRMUX_L(18)
       ||MDRMUX_L(19)||MDRMUX_L(22)||MDRMUX_L(23)||MDRMUX_L(24)
       ||MDRMUX_L(27)||MDRMUX_L(28)||MDRMUX_L(30)||MDRMUX_L(31));
SYH(3):= OPA(MDRMUX_H(3) ||MDRMUX_H(7) ||MDRMUX_H(11)||MDRMUX_H(15)
       ||MDRMUX_H(19)||MDRMUX_H(23)||MDRMUX_H(27)||MDRMUX_H(31));
SYL(3):= OPA(MDRMUX_L(0) ||MDRMUX_L(1) ||MDRMUX_L(2) ||MDRMUX_L(4)
       ||MDRMUX_L(5) ||MDRMUX_L(7) ||MDRMUX_L(8) ||MDRMUX_L(12)
       ||MDRMUX_L(14)||MbRMUX_L(18)||MDRMUX_L(22)||MDRMUX_L(25)
       ||MDRMUX_L(26)||MDRMUX_L(27)||MDRMUX_L(29)||MDRMUX_L(30));
SYH(4):= OPA(MDRMUX_H(1) ||MDRMUX_H(2) ||MDRMUX_H(4) ||MDRMUX_H(10)
       ||MDRMUX_H(12)||MDRMUX_H(14)||MDRMUX_H(15)||MDRMUX_H(16)
       ||MDRMUX_H(18)||MDRMUX_H(20)||MDRMUX_H(21)||MDRMUX_H(23)
       ||MDRMUX_H(25)||MDRMUX_H(27)||MDRMUX_H(28)||MDRMUX_H(29)
       ||MDRMUX_H(30));
SYL(4):= OPA(MDRMUX_L(0) ||MDRMUX_L(7) ||MDRMUX_L(8) ||MDRMUX_L(13)
       ||MDRMUX_L(14)||MDRMUX_L(15)||MDRMUX_L(16)||MDRMUX_L(20)
       ||MDRMUX_L(21)||MDRMUX_L(22)||MDRMUX_L(24)||MDRMUX_L(29));
SYH(5):= OPA(MDRMUX_H(0) ||MDRMUX_H(1) ||MDRMUX_H(3) ||MDRMUX_H(5)
       ||MDRMUX_H(11)||MDRMUX_H(13)||MDRMUX_H(14)||MDRMUX_H(17)
       ||MDRMUX_H(19)||MDRMUX_H(20)||MDRMUX_H(22)||MDRMUX_H(23)
       ||MDRMUX_H(24)||MDRMUX_H(25)||MDRMUX_H(26)||MDRMUX_H(27)
       ||MDRMUX_H(28)||MDRMUX_H(31));
SYL(5):= OPA(MDRMUX_L(1) ||MDRMUX_L(6) ||MDRMUX_L(7) ||MDRMUX_L(9)
       ||MDRMUX_L(12)||MDRMUx_L(13)||MDRMUX_L(14)||MDRMUX_L(17)
       ||MDRMUX_L(20)||MDRMUx_L(23)||MDRMUX_L(25)||MDRMUX_L(28)
       ||MDRMUX_L(29));
SYH(6):= OPA(MDRMUX_H(0) ||MDRMUX_H(2) ||MDRMUX_H(3) ||MDRMUX_H(6)
       ||MDRMUX_H(8) ||MDRMUX_H(10)||MDRMUX_H(12)||MDRMUX_H(13)
       ||MDRMUX_H(15)||MDRMUX_H(16)||MDRMUX_H(21)||MDRMUX_H(22)
       ||MDRMUX_H(25)||MDRMUX_H(28)||MDRMUX_H(31));
SYL(6):= OPA(MDRMUX_L(2) ||MDRMUX_L(5) ||MDRMUX_L(7) ||MDRMUX_L(10)
       ||MDRMUX_L(12)||MDRMUX_L(13)||MDRMUX_L(14)||MDRMUX_L(18)
       ||MDRMUX_L(20)||MDRMUX_L(23)||MDRMUX_L(26)||MDRMUX_L(31));
SYH(7):= OPA(MDRMUX_H(1) ||MDRMUX_H(2) ||MDRMUX_H(7) ||MDRMUX_H(9)
       ||MDRMUX_H(11)||MDRMUX_H(12)||MDRMUX_H(14)||MDRMUX_H(15)
       ||MDRMUX_H(17)||MDRMUX_H(20)||MDRMUX_H(21)||MDRMUX_H(23)
       ||MDRMUX_H(24)||MDRMUX_H(25)||MDRMUX_H(29)||MDRMUX_H(30)
       ||MDRMUX_H(31));
SYL(7):= OPA(MDRMUX_L(3) ||MDRMUX_L(4) ||MDRMUX_L(5) ||MDRMUX_L(6)
       ||MDRMUX_L(7) ||MDRMUX_L(11)||MDRMUX_L(12)||MDRMUX_L(15)
       ||MDRMUX_L(19)||MDRMUX_L(21)||MDRMUX_L(22)||MDRMUX_L(23)
       ||MDRMUX_L(27)||MDRMUX_L(30)||MDRMUX_L(31));
SYH(8):= OPA(MDRMUX_H(0) ||MDRMUX_H(4) ||MDRMUX_H(5) ||MDRMUX_H(6)
       ||MDRMUX_H(9) ||MDRMUX_H(10)||MDRMUX_H(11)||MDRMUX_H(12)
       ||MDRMUX_H(14)||MDRMUX_H(16)||MDRMUX_H(19)||MDRMUX_H(22)
       ||MDRMUX_H(25)||MDRMUX_H(26)||MDRMUX_H(31));
SYL(8):= OPA(MDRMUX_L(1) ||MDRMUX_L(3) ||MDRMUX_L(4) ||MDRMUX_L(8)
       ||MDRMUX_L(10)||MDRMUX_L(11)||MDRMUX_L(12)||MDRMUX_L(17)
       ||MDRMUX_L(18)||MDRMUX_L(20)||MDRMUX_L(25)||MDRMUX_L(28));
SYH(9):= OPA(MDRMUX_H(1) ||MDRMUX_H(4) ||MDRMUX_H(7) ||MDRMUX_H(8)
       ||MDRMUX_H(9) ||MDRMUX_H(10)||MDRMUX_H(13)||MDRMUX_H(15)
       ||MDRMUX_H(17)||MDRMUX_H(18)||MDRMUX_H(19)||MDRMUX_H(23)
       ||MDRMUX_H(24)||MDRMUX_H(25)||MDRMUX_H(27)||MDRMUX_H(30)
       ||MDRMUX_H(31));
SYL(9):= OPA(MDRMUX_L(0) ||MDRMUX_L(1) ||MDRMUX_L(2) ||MDRMUX_L(3)
       ||MDRMUX_L(5) ||MDRMUX_L(9) ||MDRMUX_L(10)||MDRMUX_L(13)
       ||MDRMUX_L(16)||MDRMUX_L(17)||MDRMUX_L(19)||MDRMUX_L(21)
       ||MDRMUX_L(24)||MDRMUX_L(25)||MDRMUX_L(29));
SYH(10):= OPA(MDRMUX_H(2) ||MDRMUX_H(4) ||MDRMUX_H(7) ||MDRMUX_H(8)
```

```
                ||MDRMUX_H(9) ||MDRMUX_H(10)||MDRMUX_H(12)||MDRMUX_H(17)
                ||MDRMUX_H(18)||MDRMUX_H(19)||MDRMUX_H(20)||MDRMUX_H(22)
                ||MDRMUX_H(24)||MDRMUX_H(26)||MDRMUX_H(27)||MDRMUX_H(29)
                ||MDRMUX_H(31));
SYL(10):= OPA(MDRMUX_L(1) ||MDRMUX_L(6) ||MDRMUX_L(8) ||MDRMUX_L(9)
                ||MDRMUX_L(11)||MDRMUX_L(14)||MDRMUX_L(16)||MDRMUX_L(18)
                ||MDRMUX_L(19)||MDRMUX_L(22)||MDRMUX_L(27)||MDRMUX_L(30));
SYH(11):= OPA(MDRMUX_H(3) ||MDRMUX_H(5) ||MDRMUX_H(6) ||MDRMUX_H(7)
                ||MDRMUX_H(8) ||MDRMUX_H(11)||MDRMUX_H(13)||MDRMUX_H(16)
                ||MDRMUX_H(17)||MDRMUX_H(18)||MDRMUX_H(21)||MDRMUX_H(23)
                ||MDRMUX_H(25)||MDRMUX_H(26)||MDRMUX_H(28)||MDRMUX_H(29)
                ||MDRMUX_H(30)||MDRMUX_H(31));
SYL(11):= OPA(MDRMUX_L(0) ||MDRMUX_L(1) ||MDRMUX_L(7) ||MDRMUX_L(8)
                ||MDRMUX_L(10)||MDRMUX_L(11)||MDRMUX_L(15)||MDRMUX_L(17)
                ||MDRMUX_L(18)||MDRMUX_L(23)||MDRMUX_L(26)||MDRMUX_L(27)
                ||MDRMUX_L(31));
```

The same circuits that are used in generating the partial check bits during the store operations are utilized again to regenerate the partial syndrome bits. So for example, partial syndrome bit i is the Exclusive-OR of the fetched data word at positions specified by 1's in the ith row of the parity check matrix. That is to say that the partial syndrome bits are generated by supplying specified signals to a set of exclusive_OR gates.

The syndrome bits SY(0...11) are then generated from the combination of the fetched data from check bits MDRMUX_C(0 . . . 11) and the address parity bits from Fetch_ADDRP(0 . . . m) which are regenerated from the incoming system address bits.

```
/******************** Syndrome Generation **************************/
SY(0)  :=
MDRMUX_C(0)   XOR SYH(0)   XOR SYL(0)              XOR FETCH_ADDRP(1);
SY(1)  :=
MDRMUX_C(1)   XOR SYH(1)   XOR SYL(1)
                           XOR FETCH_ADDRP(0)  XOR FETCH_ADDRP(1);
SY(2)  :=
MDRMUX_C(2)   XOR SYH(2)   XOR SYL(2) XOR FETCH_ADDRP(0)            ;
SY(3)  :=
MDRMUX_C(3)   XOR SYH(3)   XOR SYL(3)
                           XOR FETCH_ADDRP(0)  XOR FETCH_ADDRP(1);
SY(4)  :=
MDRMUX_C(4)   XOR SYH(4)   XOR SYL(4) XOR FETCH_ADDRP(0)            ;
SY(5)  :=
MDRMUX_C(5)   XOR SYH(5)   XOR SYL(5)              XOR FETCH_ADDRP(1);
SY(6)  :=
MDRMUX_C(6)   XOR SYH(6)   XOR SYL(6)                               ;
SY(7)  :=
MDRMUX_C(7)   XOR SYH(7)   XOR SYL(7)                               ;
SY(8)  :=
MDRMUX_C(8)   XOR SYH(8)   XOR SYL(8)                               ;
SY(9)  :=
MDRMUX_C(9)   XOR SYH(9)   XOR SYL(9)                               ;
SY(10) :=
MDRMUX_C(10)  XOR SYH(10)  XOR SYL(10)             XOR FETCH_ADDRP(1);
SY(11) :=
MDRMUX_C(11)  XOR SYH(11)  XOR SYL(11) XOR FETCH_ADDRP(0)           ;
```

The partial syndrome bits SY(0 . . . 11) 72 are then decoded 74 to identify any possible errors as illustrated in FIG. 7. Module error indicators are then generated according to the formula given below during the decoding process to detect and indicate errors.

```
/* **** Syndrome & Module Decoding ***********************************/ /*
*/ /* MOD_00 means: The most left Module 0 is defective */
MOD_00 :=   (              SY( 1) XOR SY( 2)                           XOR ^SY( 4) )
           &( SY( 0) XOR   SY( 1)                    XOR SY( 3)        XOR ^SY( 5) )
           &( SY( 0)               XOR SY( 2)        XOR SY( 3)        XOR ^SY( 6) )
           &(              SY( 1) XOR SY( 2)                           XOR ^SY( 7) )
           &( SY( 0)                                                   XOR ^SY( 8) )
           &(              SY( 1)                                      XOR ^SY( 9) )
           &(                         SY( 2)                           XOR ^SY(10) )
           &(                                            SY( 3)        XOR ^SY(11) );
MOD_01 :=   ( SY( 0)                                                   XOR ^SY( 4) )
           &(              SY( 1)                                      XOR ^SY( 5) )
           &(                         SY( 2)                           XOR ^SY( 6) )
           &(                                            SY( 3)        XOR ^SY( 7) )
           &( SY( 0) XOR   SY( 1) XOR SY( 2)                           XOR ^SY( 8) )
           &( SY( 0)                                 XOR SY( 3)        XOR ^SY( 9) )
           &( SY( 0)                                 XOR SY( 3)        XOR ^SY(10) )
           &(              SY( 1) XOR SY( 2)        XOR SY( 3)         XOR ^SY(11) );
MOD_02 :=   (                         SY( 2)                           XOR ^SY( 4) )
           &(                                            SY( 3)        XOR ^SY( 5) )
           &( SY( 0)               XOR SY( 2)                          XOR ^SY( 6) )
           &(              SY( 1)                    XOR SY( 3)        XOR ^SY( 7) )
           &(              SY( 1) XOR SY( 2)        XOR SY( 3)         XOR ^SY( 8) )
           &( SY( 0) XOR   SY( 1) XOR SY( 2)                           XOR ^SY( 9) )
           &( SY( 0) XOR   SY( 1) XOR SY( 2)                           XOR ^SY(10) )
           &( SY( 0)                                 XOR SY( 3)        XOR ^SY(11) );
MOD_03 :=   ( SY( 0)               XOR SY( 2)        XOR SY( 3)        XOR ^SY( 4) )
           &(              SY( 1) XOR SY( 2)                           XOR ^SY( 5) )
           &( SY( 0) XOR   SY( 1)                    XOR SY( 3)        XOR ^SY( 6) )
           &( SY( 0)               XOR SY( 2)        XOR SY( 3)        XOR ^SY( 7) )
           &( SY( 0)               XOR SY( 2)                          XOR ^SY( 8) )
           &(              SY( 1)                    XOR SY(3)         XOR ^SY( 9) )
           &( SY( 0)                                                   XOR ^SY(10) )
           &(              SY( 1)                                      XOR ^SY(11) );
MOD_04 :=   ( SY( 0)               XOR SY( 2)                          XOR ^SY( 4) )
           &(              SY( 1)                    XOR SY( 3)        XOR ^SY( 5) )
           &( SY( 0)                                                   XOR ^SY( 6) )
           &(              SY( 1)                                      XOR ^SY( 7) )
           &( SY( 0)                                 XOR SY( 3)        XOR ^SY( 8) )
           &(              SY( 1) XOR SY( 2)        XOR SY( 3)         XOR ^SY( 9) )
           &(              SY( 1) XOR SY( 2)        XOR SY( 3)         XOR ^SY(10) )
           &( SY( 0) XOR   SY( 1) XOR SY( 2)                           XOR ^SY(11) );
MOD_05 :=   ( SY( 0) XOR   SY( 1)                    XOR SY( 3)        XOR ^SY( 4) )
           &( SY( 0)               XOR SY( 2)        XOR SY( 3)        XOR ^SY( 5) )
           &(              SY( 1) XOR SY( 2)                           XOR ^SY( 6) )
           &( SY( 0) XOR   SY( 1)                    XOR SY( 3)        XOR ^SY( 7) )
           &(                         SY( 2)                           XOR ^SY( 8) )
           &(                                            SY( 3)        XOR ^SY( 9) )
           &( SY( 0)               XOR SY( 2)                          XOR ^SY(10) )
           &(              SY( 1)                    XOR SY( 3)        XOR ^SY(11) );
MOD_06 :=   (              SY( 1)                    XOR SY( 3)        XOR ^SY( 4) )
           &( SY( 0) XOR   SY( 1) XOR SY( 2)        XOR SY( 3)         XOR ^SY( 5) )
           &(              SY( 1)                                      XOR ^SY( 6) )
           &( SY( 0) XOR   SY( 1)                                      XOR ^SY( 7) )
           &(              SY( 1) XOR SY( 2)                           XOR ^SY( 8) )
           &( SY( 0) XOR   SY( 1)                    XOR SY( 3)        XOR ^SY( 9) )
           &( SY( 0)               XOR SY( 2)        XOR SY( 3)        XOR ^SY(10) )
           &(              SY( 1) XOR SY( 2)                           XOR ^SY(11) );
MOD_07 :=   ( SY( 0) XOR   SY( 1) XOR SY( 2)                           XOR ^SY( 4) )
           &( SY( 0)                                 XOR SY( 3)        XOR ^SY( 5) )
           &( SY( 0)                                 XOR SY( 3)        XOR ^SY( 6) )
           &(              SY( 1) XOR SY( 2)        XOR SY( 3)         XOR ^SY( 7) )
           &(                                            SY( 3)        XOR ^SY( 8) )
           &(                         SY( 2)        XOR SY( 3)         XOR ^SY( 9) )
           &(              SY( 1)                    XOR SY( 3)        XOR ^SY(10) )
           &( SY( 0) XOR   SY( 1) XOR SY( 2)        XOR SY( 3)         XOR ^SY(11) );
MOD_08 :=   ( SY( 4)                                 XOR SY( 7)        XOR ^SY( 0) )
           &(              SY( 5) XOR SY( 6)        XOR SY( 7)         XOR ^SY( 1) )
           &(              SY( 5) XOR SY( 6)        XOR SY( 7)         XOR ^SY( 2) )
           &( SY( 4) XOR   SY( 5) XOR SY( 6)                           XOR ^SY( 3) )
           &(              SY( 5)                    XOR SY( 7)        XOR ^SY( 8) )
           &( SY( 4) XOR   SY( 5) XOR SY( 6)        XOR SY( 7)         XOR ^SY( 9) )
           &(              SY( 5)                                      XOR ^SY(10) )
           &( SY( 4) XOR   SY( 5)                                      XOR ^SY(11) );
MOD_09 :=   ( SY( 8) XOR   SY( 9)                    XOR SY(11)        XOR ^SY( 0) )
           &( SY( 8)               XOR SY(10)       XOR SY(11)         XOR ^SY( 1) )
           &(              SY( 9) XOR SY(10)                           XOR ^SY( 2) )
           &( SY( 8) XOR   SY( 9)                    XOR SY(11)        XOR ^SY( 3) )
           &(                                            SY(11)        XOR ^SY( 4) )
           &(                         SY(10)       XOR SY(11)          XOR ^SY( 5) )
```

-continued

```
            &(            SY( 9)          XOR  SY(11)  XOR  ^SY( 6) )
            &( SY( 8) XOR SY( 9) XOR SY(10) XOR SY(11) XOR  ^SY( 7) );
MOD_10 :=   ( SY( 4) XOR SY( 5) XOR SY( 6) XOR SY( 7) XOR  ^SY( 0) )
            &( SY( 4)            XOR SY( 6)           XOR  ^SY( 1) )
            &( SY( 4) XOR SY( 5)                      XOR  ^SY( 2) )
            &( SY( 4)                                 XOR  ^SY( 3) )
            &( SY( 4)            XOR SY( 6) XOR SY( 7) XOR ^SY( 8) )
            &(            SY( 5) XOR SY( 6)           XOR  ^SY( 9) )
            &( SY( 4) XOR SY( 5)           XOR SY( 7) XOR  ^SY(10) )
            &( SY( 4)            XOR SY( 6) XOR SY( 7) XOR ^SY(11) );
MOD_11 :=   (                        SY(10) XOR SY(11) XOR XOR SY( 0) )
            &(                        SY(10)          XOR  SY( 1) )
            &( SY( 8) XOR SY( 9) XOR SY(10) XOR SY(11) XOR ^SY( 2) )
            &( SY( 8)            XOR SY(10)           XOR  ^SY( 3) )
            &(            SY( 9) XOR SY(10) XOR SY(11) XOR ^SY( 4) )
            &( SY( 8) XOR SY( 9) XOR SY(10)           XOR  ^SY( 5) )
            &( SY( 8) XOR SY( 9) XOR SY(10)           XOR  ^SY( 6) )
            &( SY( 8)                       XOR SY(11) XOR ^SY( 7) );
MOD_12 :=   ( SY( 4) XOR SY( 5)                      XOR  ^SY( 0) )
            &( SY( 4)                                 XOR  ^SY( 1) )
            &(                        SY( 6) XOR SY( 7) XOR ^SY( 2) )
            &(                        SY( 6)          XOR  ^SY( 3) )
            &(            SY( 5) XOR SY( 6)           XOR  ^SY( 8) )
            &( SY( 4) XOR SY( 5)           XOR SY( 7) XOR  ^SY( 9) )
            &( SY( 4)            XOR SY( 6) XOR SY( 7) XOR ^SY(10) )
            &(            SY( 5) XOR SY( 6)           XOR  ^SY(11) );
MOD_13 :=   ( SY( 8) XOR SY( 9)                      XOR  ^SY( 0) )
            &( SY( 8)                                 XOR  ^SY( 1) )
            &(                        SY(10) XOR SY(11) XOR ^SY( 2) )
            &(                        SY(10)          XOR  ^SY( 3) )
            &( SY( 8) XOR SY( 9) XOR SY(10)           XOR  ^SY( 4) )
            &( SY( 8)                       XOR SY(11) XOR ^SY( 5) )
            &( SY( 8)                       XOR SY(11) XOR ^SY( 6) )
            &(            SY( 9) XOR SY(10) XOR SY(11) XOR ^SY( 7) );
MOD_14 :=   ( SY( 4) XOR SY( 5) XOR SY( 6)           XOR  ^SY( 0) )
            &( SY( 4)                       XOR SY( 7) XOR ^SY( 1) )
            &( SY( 4)                       XOR SY( 7) XOR ^SY( 2) )
            &(            SY( 5) XOR SY( 6) XOR SY( 7) XOR ^SY( 3) )
            &(            SY( 5)                      XOR  ^SY( 8) )
            &( SY( 4) XOR SY( 5)                      XOR  ^SY( 9) )
            &(                                SY( 7) XOR  ^SY(10) )
            &(                        SY( 6) XOR SY( 7) XOR ^SY(11) );
MOD_15 :=   (            SY( 9) XOR SY(10)           XOR  ^SY( 0) )
            &( SY( 8) XOR SY( 9)           XOR SY(11) XOR  ^SY( 1) )
            &( SY( 8)            XOR SY(10) XOR SY(11) XOR ^SY( 2) )
            &(            SY( 9) XOR SY(10)           XOR  ^SY( 3) )
            &(            SY( 9)                      XOR  ^SY( 4) )
            &( SY( 8) XOR SY( 9)                      XOR  ^SY( 5) )
            &(                                SY(11) XOR  ^SY( 6) )
            &(                        SY(10) XOR SY(11) XOR ^SY( 7) );
MOD_16 :=   (                                              ^SY( 4) )
            &(                                             ^SY( 5) )
            &(                                             ^SY( 6) )
            &(                                             ^SY( 7) )
            &(                                             ^SY( 8) )
            &(                                             ^SY( 9) )
            &(                                             ^SY(10) )
            &(                                             ^SY(11) );
MOD_17 :=   (                                              ^SY( 0) )
            &(                                             ^SY( 1) )
            &(                                             ^SY( 2) )
            &(                                             ^SY( 3) )
            &(                                             ^SY( 8) )
            &(                                             ^SY( 9) )
            &(                                             ^SY(10) )
            &(                                             ^SY(11) );
MOD_18 :=   (                                              ^SY( 0) )
            &(                                             ^SY( 1) )
            &(                                             ^SY( 2) )
            &(                                             ^SY( 3) )
            &(                                             ^SY( 4) )
            &(                                             ^SY( 5) )
            &(                                             ^SY( 6) )
            &(                                             ^SY( 7) );
```

FIG. 8 illustrates a set of module errors indicators MOD_00, MOD_01, ... MOD_18 74. Any error will cause the setting of one of the MOD's. For example an error in module 0 will cause MOD_00 to be set to 1. During the decoding operations, bit error indicators are also generated from circuit lines which are later used to invert the fetched data bits to correct certain errors. Invert lines 81 INV_H(0 ... 31) 84, INV_L(0 ... 31), and INV_C(0 ... 11) are used in conjunction with bit errors so that when a bit error indicator is on, the corresponding data bit is corrected by inversion of the data. Bit error indicators 82 are generated from the following equations.

```
/* ********** Invert Enabling ***************************** */
INV_H(0..3)    := MOD_00  GATE  SY(0..3);
INV_H(4..7)    := MOD_01  GATE  SY(0..3);
INV_H(8..11)   := MOD_02  GATE  SY(0..3);
INV_H(12..15)  := MOD_03  GATE  SY(0..3);
INV_H(16..19)  := MOD_04  GATE  SY(0..3);
INV_H(20..23)  := MOD_05  GATE  SY(0..3);
INV_H(24..27)  := MOD_06  GATE  SY(0..3);
INV_H(28..31)  := MOD_07  GATE  SY(0..3);
INV_L(0..3)    := MOD_08  GATE  SY(4..7);
INV_L(4..7)    := MOD_09  GATE  SY(8..11);
INV_L(8..11)   := MOD_10  GATE  SY(4..7);
INV_L(12..15)  := MOD_11  GATE  SY(8..11);
INV_L(16..19)  := MOD_12  GATE  SY(4..7);
INV_L(20..23)  := MOD_13  GATE  SY(8..11);
INV_L(24..27)  := MOD_14  GATE  SY(4..7);
INV_L(28..31)  := MOD_15  GATE  SY(8..11);
INV_C(0..3)    := MOD_16  GATE  SY(0..3);
INV_C(4..7)    := MOD_17  GATE  SY(4..7);
INV_C(8..11)   := MOD_18  GATE  SY(8..11);
```

In this manner, the status of the module error and the syndromes are to enable a plurality of invert lines and generate other signals pertaining to types of errors 78 including a UE (Uncorrectable error) signal 79 or a CE (Correctable Error) signal 77.

```
*************** Error Indication ***************************/
ECC_ANYE :=  SY( 0) | SY( 1) | SY( 2) | SY( 3)
             SY( 4) | SY( 5) | SY( 6) | SY( 7)
             SY( 8) | SY( 9) | SY(10) | SY(11) :
ECC CE :=   ( MOD_00 | MOD 01 | MOD 02 | MOD 03
             MOD_04 | MOD_05 | MOD_06 | MOD_07
             MOD_08 | MOD_09 | MOD_10 | MOD_11
             MOD_12 | MOD 13 | MOD_14 | MOD_15
             MOD_16 | MOD_17 | MOD_18     );
ECC_UCE :=   ECC_ANYE & ECC_CE;
/*************************************************/ /*>
INVERT AND FETCH_ECC_OUTPUT <*/
/*************************************************/
STEP3_IN_H(0..31):=MDRMUX_OUT_H(0..31) XOR INV_H(0..31);
STEP3_IN_L(0..31):=MDRMUX_OUT_L(0..31) XOR INV_L(0..31);
STEP3_IN_C(0..11):=MDRMUX_OUT_C(0..11) XOR INV_C(0..11);
```

FIG. 9 illustrates the arrangement of data in the memory modules on the SIMMS. There are 19 memory modules in a SIMM; a number of SIMMs can therefore be configured in this way into the memory. As illustrated, the data bits and check bits are divided into 4 bit symbols to store in 19 memory modules. SEC_0_H(0 ... 31) are stored in modules 1 to 8, SEC_0_L(0 ... 31) are stored in modules 9 to 16, and SEC_0_C(0 ... 11) are stored in modules 17 to 19. The mapping of system address bits to memory modules depends on the module size as shown in Table IV and FIG. 9.

It should be seen from above that the coding method and circuits and apparatus of the present invention have provided a mechanism for improved reliability and availability of computer memory systems.

While the present invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. In a computer system, a method of encoding data bits which are b bits in length, said method comprising the steps of:

receiving a plurality of incoming system address bit strings;

generating at least one address parity bit from each said string of received system address data bits;

generating from said address parity bits and said data bits a multiplicity, k, of multisegment final check bit vectors in which each segment of said final check bit vector is b bits long;

storing said final check bit vectors and said data bits in separate storage locations in memory of said computer system;

grouping said data bits into a first high data word group, and a second low data word group;

generating a multiplicity of partial high check bit vectors and a multiplicity of partial low check bit vectors, each partial check bit vector having a multiplicity of segments each being b bits long; and generating said final check bit vector by combining said partial high and said partial low check bit vectors with said address parity bit.

2. The method of claim 1, further comprising storing high data word and said low data word into storage locations in memory of said computer.

3. The method of claim 1, wherein said first half of data is grouped as to form said first high data word group and said second half of data is grouped as to form said second low data word group.

4. The method of claim 3, wherein each data word group contains at least 32 bits of data.

5. The method of claim 1, wherein n bits of address parity is generated from each string of system address data bits.

6. The method of claim 1, two bits of address parity is generated from each string of system address data bit.

7. The method of claim 6, four bits of address parity is generated from each string of system address data bit.

8. The method of claim 6, eight bits of address parity is generated from each string of system address data bit.

9. In a computer system environment having a memory for storing data, said memory also having a location for storing at least one multisegmented final check bit vector, a method of decoding electrical signals for correcting errors in symbols which are b bits in length, said method comprising the steps of:

retrieving data from memory of said computer system;

receiving a plurality of incoming system address bit strings;

generating at least one address parity bit from each received string of system address bits;

retrieving all multisegmented final check bit vectors previously stored in said memory of said computer system;

grouping said retrieved data bits into at least two groups, each group generating a multiplicity of multisegmented partial syndrome bit vectors, each segment being b bits long; and combining said partial syndrome bit vectors with said final check bit vectors and said address parity bits to generate said final syndrome bit vectors, generating from said address parity bits and said data bits a multiplicity, k, of multisegment final syndrome vectors in which each segment in each of said k final syndrome vector is b bits long;

decoding said final syndrome vectors to determine an error pattern; and correcting said signal in those symbol bits for which said syndrome vector and said overall syndrome vector match, said correction being determined by the error pattern for that symbol.

10. The method of claim 9, wherein said data bits are grouped to generate a set of first high partial syndrome bit vectors, each of said vectors having a multiplicity of b bit long segments, and a second set of low partial syndrome bit vectors, each of said vectors having a multiplicity of b bit long segments.

11. The method of claim 9, wherein said data bits and said partial syndrome bit vectors are combined with said address parity bits using Exclusive-OR gates.

12. The method of claim 9, wherein n bits of address parity are generated from said system address bits.

13. The method of claim 9 further comprising the step of determining an error pattern by examining each of said k final syndrome vectors to determine which one matches a corresponding overall syndrome vector in all of its segments excepting any segment representing an error pattern.

14. A method of detecting errors in data blocks of a computer system, in which each block is b bits in length, said method comprising the steps of:

generating at least one address parity bit from each received string of system address data bits;

encoding said data blocks by generating from said address parity bit and said data bits a multiplicity, k, of multisegment final check bit vectors in which each segment of said check bit vector is b bits long;

storing said final check bit vectors and said data in a plurality of separate storage locations in memory of said computer system;

retrieving all information stored in said storage locations from memory of said computer system; said data retrieved being grouped into a first high data word group, and a second low data word group, each group further generating a partial syndrome bit;

generating a multiplicity of partial high check bit vectors and a multiplicity of partial low check bit vectors, each partial check bit vector having a multiplicity of segments each being b bits long; and receiving a plurality of system address bit strings;

generating at least one address parity bit from each string of system address bits;

generating from said data address parity bits, said data bits, and said final check bit vectors, a multiplicity, k, of multisegment final syndrome bit vectors in which each segment k of said final syndrome vector is b bits long;

generating said final check bit vectors by combining said partial high and said partial low check bit vectors with said address parity bits;

decoding said final syndrome bit to determine any possible error pattern;

correcting said signal in those symbol bits for which said final syndrome vector and said overall syndrome vector match, said correction being determined by the error pattern for that symbol.

15. The method of claim 14, further comprising storing said high data word and said low data word in separate memory locations in said computer system.

16. The method of claim 14, wherein said first half of data is grouped in said first high data word group and said second half of data is grouped in said second low data word group.

17. The method of claim 16, wherein each data word group contains at least 32 bits of data.

18. The method of claim 14, wherein said step of correcting said signal further comprises the step of generating an error detection signal for those symbols bits for which a subsyndrome match is not found, said error detection signal indicating the type of error pattern detected for that symbol.

19. In computer system, an apparatus for encoding data bits which are b bits in length, said apparatus comprising:

an address parity generator for generating at least one address parity bit for each string of system address data bits received;

a check bit generator for generating a multiplicity, k, of multisegment final check bit vectors from said data bits and said address parity bits, each segment of said final check bit vector being b bits long; and said generator also generating a multiplicity of partial high check bit vectors and a multiplicity of partial low check bit vectors, each partial check bit vector having a multiplicity of segments each being b bits long;

means for grouping said data bits into a first high data word group, and a second low data word group;

a final check bit generator for generating a final check bit vector by combining said partial high and said partial low check bit vectors with said address parity bit; and a plurality of storage arrays for storing said check bit vectors, said data bits including said system address bits, in separate storage locations in memory of said computer system.

20. The apparatus of claim 19, wherein n bits of address parity is generated from each string of system address data bits.

21. The apparatus of claim 19 further comprising:

a special storage array for keeping previously multiplicity of multisegment final check bit vectors;

at least one communication data bus for retrieving said information from said memory storage arrays;

a final syndrome vector generator for generating from said address parity bits and said data bits a multiplicity, k, of multisegment final syndrome vectors in which each segment in each of said k final syndrome vector is b bits long;

a syndrome decoder for determining any error patterns;

at least one address error bit for indicating and correcting errors.

* * * * *